(12) United States Patent
Takezawa et al.

(10) Patent No.: US 11,840,619 B2
(45) Date of Patent: *Dec. 12, 2023

(54) EPOXY RESIN COMPOSITION, THERMALLY-CONDUCTIVE MATERIAL PRECURSOR, B-STAGE SHEET, PREPREG, HEAT DISSIPATION MATERIAL, LAMINATE, METAL SUBSTRATE, AND PRINTED CIRCUIT BOARD

(71) Applicant: HITACHI CHEMICAL COMPANY, LTD., Tokyo (JP)

(72) Inventors: Yoshitaka Takezawa, Tokyo (JP); Shingo Tanaka, Hitachi (JP); Fusao Hojo, Hitachi (JP)

(73) Assignee: RESONAC CORPORATION, Tokyo (JP)

( * ) Notice: Subject to any disclaimer, the term of this patent is extended or adjusted under 35 U.S.C. 154(b) by 150 days.

This patent is subject to a terminal disclaimer.

(21) Appl. No.: 16/736,997

(22) Filed: Jan. 8, 2020

(65) Prior Publication Data
US 2020/0140651 A1    May 7, 2020

Related U.S. Application Data

(63) Continuation of application No. 15/575,440, filed as application No. PCT/JP2016/065089 on May 20, 2016, now Pat. No. 10,584,228.

(30) Foreign Application Priority Data

May 22, 2015  (JP) .................................. 2015-104427

(51) Int. Cl.
C08K 3/38       (2006.01)
B32B 15/092    (2006.01)
(Continued)

(52) U.S. Cl.
CPC ................ *C08K 3/38* (2013.01); *B32B 5/024* (2013.01); *B32B 15/092* (2013.01); *B32B 15/14* (2013.01);
(Continued)

(58) Field of Classification Search
None
See application file for complete search history.

(56) References Cited

U.S. PATENT DOCUMENTS

2012/0149807 A1    6/2012  Asaumi
2013/0189514 A1    7/2013  Nishiyama et al.
(Continued)

FOREIGN PATENT DOCUMENTS

CN    102482242 A    5/2012
CN    103242510 A    8/2013
(Continued)

OTHER PUBLICATIONS

International Search Report for PCT/JP2016/065089 dated Jul. 19, 2016; English translation submitted herewith (5 pages).

*Primary Examiner* — Megan McCulley
(74) *Attorney, Agent, or Firm* — FITCH, EVEN, TABIN & FLANNERY, LLP

(57) ABSTRACT

Provided are an epoxy resin composition including hexagonal boron nitride particles having an aspect ratio of 2 or more, a liquid crystalline epoxy monomer, and a curing agent, and the epoxy resin composition being capable of forming a resin matrix having a smectic domain by reacting the liquid crystalline epoxy monomer with the curing agent, and a thermally-conductive material precursor, a B-stage sheet, a prepreg, a heat dissipation material, a laminate, a metal substrate, and a printed circuit board, which use the epoxy resin composition.

21 Claims, 1 Drawing Sheet

(51) Int. Cl.
  *B32B 27/18* (2006.01)
  *B32B 27/26* (2006.01)
  *B32B 27/38* (2006.01)
  *H05K 1/03* (2006.01)
  *C08L 63/00* (2006.01)
  *C08G 59/24* (2006.01)
  *C08G 59/20* (2006.01)
  *C08J 5/24* (2006.01)
  *B32B 5/02* (2006.01)
  *B32B 15/14* (2006.01)
  *H05K 1/02* (2006.01)

(52) U.S. Cl.
  CPC .............. *B32B 27/18* (2013.01); *B32B 27/26* (2013.01); *B32B 27/38* (2013.01); *C08G 59/20* (2013.01); *C08G 59/24* (2013.01); *C08G 59/245* (2013.01); *C08J 5/249* (2021.05); *C08L 63/00* (2013.01); *H05K 1/0201* (2013.01); *H05K 1/03* (2013.01); *H05K 1/0373* (2013.01); *B32B 2260/021* (2013.01); *B32B 2260/046* (2013.01); *B32B 2262/101* (2013.01); *B32B 2307/302* (2013.01); *B32B 2457/08* (2013.01); *C08J 2363/04* (2013.01); *C08K 2003/385* (2013.01)

(56) References Cited

U.S. PATENT DOCUMENTS

| | | | |
|---|---|---|---|
| 2013/0200298 | A1 | 8/2013 | Izutani |
| 2015/0090922 | A1* | 4/2015 | Hatakeyama ........... B29C 43/24 252/74 |
| 2016/0247595 | A1 | 8/2016 | Song |

FOREIGN PATENT DOCUMENTS

| | | |
|---|---|---|
| CN | 103249695 A | 8/2013 |
| JP | H11-323162 A | 11/1999 |
| JP | 2007-182494 A | 7/2007 |
| JP | 2007-224269 A | 9/2007 |
| JP | 2008-510878 A | 4/2008 |
| JP | 2011-503241 A | 1/2011 |
| JP | 2011-208007 A | 10/2011 |
| JP | 2014-201610 A | 10/2014 |
| JP | 2016-023227 A | 2/2016 |
| WO | 2012/002505 A1 | 8/2013 |
| WO | 2012/046814 A1 | 2/2014 |
| WO | 2016/093248 A1 | 9/2017 |

* cited by examiner

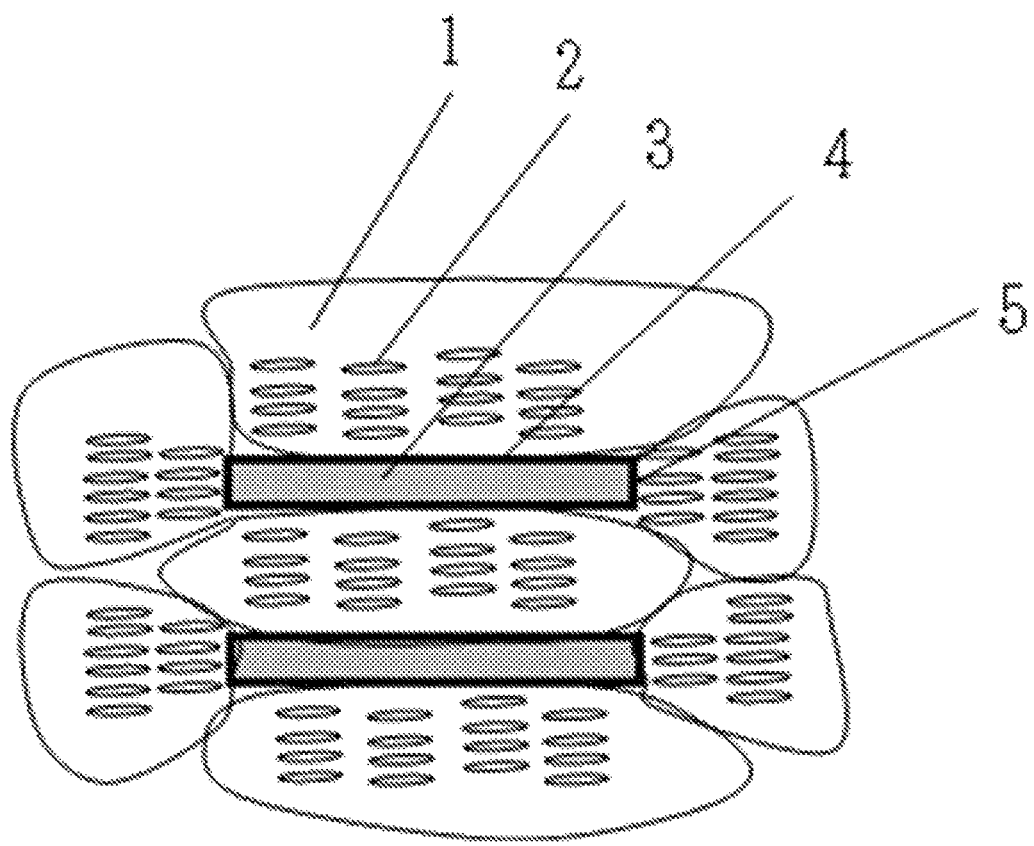

EPOXY RESIN COMPOSITION, THERMALLY-CONDUCTIVE MATERIAL PRECURSOR, B-STAGE SHEET, PREPREG, HEAT DISSIPATION MATERIAL, LAMINATE, METAL SUBSTRATE, AND PRINTED CIRCUIT BOARD

CROSS-REFERENCE TO RELATED APPLICATIONS

This application is a continuation application of U.S. patent application Ser. No. 15/575,440 filed Nov. 20, 2017, which is a U.S. national phase entry filed under 35 U.S.C. § 371 of International Application No. PCT/JP2016/065089, filed May 20, 2016, designating the United States, which claims benefit of the filing date of JP 2015-104427, filed May 22, 2015, the contents of each of which are incorporated herein by reference in its entirety.

TECHNICAL FIELD

The present invention relates to an epoxy resin composition, a thermally-conductive material precursor, a B-stage sheet, a prepreg, a heat dissipation material, a laminate, a metal substrate, and a printed circuit board.

BACKGROUND ART

In recent years, with the increase in energy density due to miniaturization and high performance of electronic devices, the amount of heat generation per unit volume tends to increase, so that high thermal conductivity is demanded for insulating materials constituting such electronic devices. Epoxy resin is widely used as an insulating material from the viewpoint of high dielectric strength and ease of molding. As a method of increasing the thermal conductivity of an epoxy resin, for example, Japanese Patent Application Laid-Open (JP-A) No. H11-323162 describes that it is effective to utilize a liquid crystalline epoxy resin obtained by polymerizing a resin composition containing a monomer having a highly oriented mesogenic group.

Further, in order to increase the thermal conductivity of an epoxy resin, a method of adding a thermally conductive filler having a high thermal conductivity and an insulating property to a resin to be composited is generally used. Examples of the thermally conductive filler include boron nitride particles and alumina particles.

The shape of the thermally conductive filler may be spherical, ellipsoidal, scale-like, plate-like, and the like, and is selected according to the application. As a method of increasing the thermal conductivity in the thickness direction when the filler is formed into a sheet-shaped cured product, for example, Japanese National-Phase Publication (JP-A) No. 2008-510878 describes that it is effective to incorporate a specific spherical boron nitride aggregate having an average aspect ratio of less than 2 into a polymer matrix.

As a method of increasing the thermal conductivity of a composite of a resin and a thermally conductive filler, for example, Japanese National-Phase Publication (JP-A) No. 2011-503241 describes that it is effective to form an ordered resin shell around a thermally conductive filler so that the resin molecules align perpendicular to the surface of the thermally conductive filler, and furthermore, to overlap the ordered resin shells so that a continuous path is formed by the ordered resin shells.

SUMMARY OF INVENTION

Technical Problem

However, when a spherical boron nitride aggregate having a small aspect ratio is used as disclosed in JP-A No. 2008-510878, although the thermal conductivity in the thickness direction of the sheet-shaped cured product can be increased, there was a tendency for the dielectric strength to decrease.

When hexagonal boron nitride particles are used as a thermally conductive filler, since there is no functional group on a (001) crystal face of a hexagonal boron nitride particle, the alignment direction of the resin molecules is not perpendicular to the (001) crystal face, and it was difficult to increase the thermal conductivity by the method described in JP-A No. 2011-503241.

In view of the above circumstances, an object of the present invention is to provide an epoxy resin composition containing hexagonal boron nitride particles and being capable of forming a cured product having high thermal conductivity and high dielectric strength, and a thermally-conductive material precursor, a B-stage sheet, a prepreg, a heat dissipation material, a laminate, a metal substrate, and a printed circuit board using the epoxy resin composition.

Solution to Problem

Specific embodiments for achieving the object are as follows.

<1> An epoxy resin composition comprising:

hexagonal boron nitride particles having an aspect ratio of 2 or more;

a liquid crystalline epoxy monomer; and a curing agent, the epoxy resin composition being capable of forming a resin matrix having a smectic domain by reacting the liquid crystalline epoxy monomer with the curing agent.

<2> The epoxy resin composition according to <1>, in which, in the smectic domain, a periodic structure is formed in a direction intersecting with a (100) crystal face of a hexagonal boron nitride particle, and a periodic structure is formed in a direction along a (001) crystal face of the hexagonal boron nitride particle.

<3> The epoxy resin composition according to <1> or <2>, in which a content of the hexagonal boron nitride particles is 50% by mass or more with respect to a total solid content.

<4> The epoxy resin composition according to any one of <1> to <3>, in which the hexagonal boron nitride particles are subjected to an oxidation treatment.

<5> The epoxy resin composition according to any one of <1> to <4>, in which the smectic domain has a periodic structure having one cycle length of from 2 nm to 4 nm.

<6> The epoxy resin composition according to any one of <1> to <5>, in which the ratio of the smectic domain in a cured product of the epoxy resin composition is 60% by volume or more based on the entire resin matrix.

<7> The epoxy resin composition according to any one of <1> to <6>, in which the liquid crystalline epoxy monomer comprises a monomer represented by the following Formula (I).

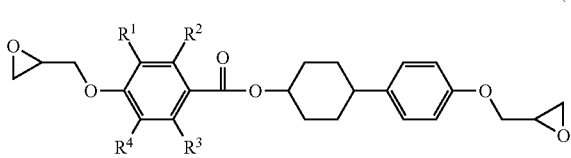

in which, in Formula (I), each of $R^1$ to $R^4$ independently represents a hydrogen atom or an alkyl group having from 1 to 3 carbon atoms.

<8> The epoxy resin composition according to any one of <1> to <7>, in which the curing agent comprises a phenol novolak resin.

<9> A thermally-conductive material precursor, containing a semi-cured product of the epoxy resin composition according to any one of <1> to <8>.

<10> The thermally-conductive material precursor according to <9>, in which the semi-cured product comprises a resin matrix having a smectic domain.

<11> The thermally conductive material precursor according to <10>, in which, in the smectic domain, a periodic structure is formed in a direction intersecting with a (100) crystal face of a hexagonal boron nitride particle, and a periodic structure is formed in a direction along a (001) crystal face of the hexagonal boron nitride particle.

<12> The thermally-conductive material precursor according to <10> or <11>, in which the smectic domain has a periodic structure having one cycle length is from 2 nm to 4 nm.

<13> A B-stage sheet, containing a sheet-shaped semi-cured product of the epoxy resin composition according to any one of <1> to <8>.

<14> The B-stage sheet according to <13>, in which the semi-cured product comprises a resin matrix having a smectic domain.

<15> The B-stage sheet according to <14>, in which, in the smectic domain, a periodic structure is formed in a direction intersecting with a (100) crystal face of a hexagonal boron nitride particle, and a periodic structure is formed in a direction along a (001) crystal face of the hexagonal boron nitride particle.

<16> The B-stage sheet according to <14> or <15>, in which the smectic domain has a periodic structure having one cycle length of from 2 nm to 4 nm.

<17> A prepreg comprising:
a fiber substrate; and
a semi-cured product of the epoxy resin composition according to any one of <1> to <8> impregnated in the fiber substrate.

<18> A heat dissipation material, containing a cured product of the epoxy resin composition according to any one of <1> to <8>.

<19> A laminate comprising:
an adherend; and
a cured layer of at least one resin-containing layer selected from the group consisting of a resin layer formed from the epoxy resin composition according to any one of <1> to <8>, the B-stage sheet according to any one of <13> to <16>, and the prepreg according to <17>, disposed on the adherend.

<20> A metal substrate comprising:
a metal foil;
a metal plate; and
a cured layer of at least one resin-containing layer selected from the group consisting of a resin layer fainted from the epoxy resin composition according to any one of <1> to <8>, the B-stage sheet according to any one of <13> to <16>, and the prepreg according to <17>, disposed between the metal foil and the metal plate.

<21> A printed circuit board comprising:
a wiring layer;
a metal plate; and
a cured layer of at least one resin-containing layer selected from the group consisting of a resin layer formed from the epoxy resin composition according to any one of <1> to <8>, the B-stage sheet according to any one of <13> to <16>, and the prepreg according to <17>, disposed between the wiring layer and the metal plate.

Advantageous Effects of Invention

According to the present invention, an epoxy resin composition containing hexagonal boron nitride particles and being capable of forming a cured product having high thermal conductivity and high dielectric strength, and a thermally-conductive material precursor, a B-stage sheet, a prepreg, a heat dissipation material, a laminate, a metal substrate, and a printed circuit board using the epoxy resin composition can be provided.

BRIEF DESCRIPTION OF DRAWINGS

FIG. 1 is a schematic diagram illustrating an example of a periodic structure in a smectic domain.

DESCRIPTION OF EMBODIMENTS

An embodiment of an epoxy resin composition, a thermally-conductive material precursor, a B-stage sheet, a prepreg, a heat dissipation material, a laminate, a metal substrate, and a printed circuit board in the invention will be described below. However, the invention is not limited to the following embodiments. In the following embodiments, the constituent elements (including elemental steps or the like) are not indispensable unless otherwise specified, except when it is considered to be obviously essential in principle, or the like. The same applies to numerical values and ranges thereof, and does not limit the invention.

The term "process" as used herein indicates not only a separate process but also a process that is not clearly distinguished from other processes as long as the desired effect of the process is obtained therefrom.

In the present specification, each numerical range specified using "(from) . . . to . . . " represents a range including the numerical values noted before and after "to" as the minimum value and the maximum value, respectively.

In the present specification, with respect to numerical ranges stated hierarchically herein, the upper limit or the lower limit of a numerical range of a hierarchical level may be replaced with the upper limit or the lower limit of a numerical range of another hierarchical level. Further, in the present specification, with respect to a numerical range, the upper limit or the lower limit of the numerical range may be replaced with a relevant value shown in any of Examples.

In referring herein to a content of a component in a composition, when plural kinds of substances exist corresponding to a component in the composition, the content means, unless otherwise specified, the total amount of the plural kinds of substances existing in the composition.

In referring herein to a particle diameter of a component in a composition, when plural kinds of particles exist corresponding to a component in the composition, the particle diameter means, unless otherwise specified, a value with respect to the mixture of the plural kinds of particles existing in the composition.

The term "layer" comprehends herein not only a case in which the layer is formed over the whole observed region where the layer is present, but also a case in which the layer is formed only on part of the region.

The term "layered" as used herein indicates "disposed on or above", in which two or more layers may be bonded or detachable.

Herein, an average thickness (also referred to as the average value of the thickness) of a sheet, a fiber substrate, a prepreg, a layer, or a laminate is determined as a value given as an arithmetic average value of a thicknesses of 5 points randomly selected on the sheet, the fiber substrate, the prepreg, the layer, or the laminate to be measured. The thickness of the sheet, the fiber substrate, the prepreg, the layer, or the laminate can be measured using a micrometer or the like. Herein, when the thickness of the layer or the laminate can be directly measured, it is measured with a micrometer. On the other hand, when measuring the thickness of one layer constituting a part of the laminate or a total thickness of a plurality of layers constituting a part of the laminate, measurement is performed by observing a cross section parallel to a lamination direction of the laminate using an electron microscope.

<Epoxy Resin Composition>

The epoxy resin composition in the present embodiment contains hexagonal boron nitride particles having an aspect ratio of 2 or more, liquid crystalline epoxy monomer, and a curing agent, and the epoxy resin composition being capable of forming a resin matrix having a smectic domain by reacting the liquid crystalline epoxy monomer with the curing agent. The epoxy resin composition may further contain other components. The epoxy resin composition in the present embodiment having the above structure can form a cured product having high thermal conductivity and high dielectric strength.

Components of the epoxy resin composition will be described in detail below.

(Hexagonal Boron Nitride Particles)

The epoxy resin composition in the present embodiment contains hexagonal boron nitride particles having an aspect ratio of 2 or more. Here, the aspect ratio can be obtained by dividing a volume average particle diameter by an average thickness.

The volume average particle diameter of hexagonal boron nitride particles is measured by laser diffraction method. The measurement by the laser diffraction method can be carried out by using a laser diffraction scattering particle size distribution measuring apparatus (for example, product name: "LS230" manufactured by Beckman Coulter, Inc.). The volume average particle diameter of hexagonal boron nitride particles in the epoxy resin composition is measured by extracting the hexagonal boron nitride particles from the epoxy resin composition, and then using a laser diffraction scattering particle size distribution measuring apparatus.

Specifically, hexagonal boron nitride particles are extracted from the epoxy resin composition using an organic solvent, nitric acid, aqua regia, or the like, and dispersed sufficiently by an ultrasonic disperser or the like to prepare a dispersion. The volume cumulative distribution curve of this dispersion is measured by a laser diffraction scattering particle size distribution measuring apparatus. By obtaining the particle diameter (D50) at 50% accumulation when the volume cumulative distribution curve is drawn from the small diameter side as the volume average particle diameter, the volume average particle diameter of the hexagonal boron nitride particles contained in the epoxy resin composition is measured.

Even after semi-curing or after curing of an epoxy resin composition, the volume average particle diameter of the hexagonal boron nitride particles can be measured in the same manner. Specifically, after extracting hexagonal boron nitride particles from a semi-cured product or a cured product, the volume average particle diameter of the hexagonal boron nitride particles can be measured by using a laser diffraction scattering particle size distribution measuring apparatus.

The average thickness of hexagonal boron nitride particles can be obtained from the arithmetic mean of the thicknesses of 30 hexagonal boron nitride particles randomly measured with a scanning electron microscope (for example, product name: "S900" manufactured by Hitachi, Ltd.). The thickness of a hexagonal boron nitride particle means a value of an interplanar distance to be the minimum when the hexagonal boron nitride particle is sandwiched between two parallel planes.

By using hexagonal boron nitride particles having an aspect ratio of 2 or more, the orientation property of a liquid crystalline epoxy monomer in an epoxy resin composition and the orientation property of a liquid crystalline epoxy resin in a cured product of the epoxy resin composition tend to increase. As a result, the thermal conductivity of the cured product of the epoxy resin composition tends to be improved. By using hexagonal boron nitride particles having an aspect ratio of 2 or more, the dielectric strength tends to be improved as compared with the case of using hexagonal boron nitride particles having an aspect ratio of less than 2.

The aspect ratio of hexagonal boron nitride particles is preferably from 2 to 7 from the viewpoints of the thermal conductivity in the thickness direction of the cured product, the dielectric strength of the cured product, and the handling properties in the case of forming into a sheet.

From the viewpoint of using hexagonal boron nitride particles as a thermally conductive filler of a heat dissipation material, the volume average particle diameter of the hexagonal boron nitride particles is preferably from 0.01 μm to 1 mm, from the viewpoint of highly filling the hexagonal boron nitride particles, is more preferably from 0.10 μm to 100 μm, and from the viewpoint of handling properties when formed into a sheet, is more preferably from 0.10 μm to 50 μm, and particularly preferably from 0.10 μm to 20 μm.

The hexagonal boron nitride particles may be any of single crystal particles, single crystal aggregated particles, polycrystalline particles, polycrystalline aggregated particles, or the like.

The shape of the hexagonal boron nitride particles may be any of an ellipsoidal shape, a scaly shape, a plate shape, or the like as long as the aspect ratio is 2 or more. The single crystal of the hexagonal boron nitride particles is in the form of a flake or a plate, and is preferably in the form of a scale from the viewpoint of an orientation property of a liquid crystalline epoxy monomer.

A method of producing hexagonal boron nitride particles is not particularly limited, and hexagonal boron nitride particles may be produced by any production method such as a direct nitriding method, a reduction nitriding method, or a gas phase reaction method.

In order to increase an affinity between hexagonal boron nitride particles and a resin matrix, the hexagonal boron nitride particles preferably have a polarity term of a surface energy of 1 mN/m or more. By adding hexagonal boron nitride particles having the polarity term of the surface energy of 1 mN/m or more to an epoxy resin composition, the dispersibility of the hexagonal boron nitride particles can be improved without lowering the thermal conductivity as compared with the case of adding a dispersant having a low thermal conductivity together with the hexagonal boron nitride particles to the epoxy resin composition, thereby improving handling properties when formed into a sheet.

In general, since the surface energy of inorganic nitride particles is small, hexagonal boron nitride particles tend not to have excellent dispersibility in epoxy monomers (and epoxy resins). Hexagonal boron nitride particles have high affinity for nonpolar liquids and exhibit hydrophobicity, but have low affinity for polar liquids and poor hydrophilicity. Here, since an epoxy group of an epoxy monomer is a hydrophilic group, it is considered that it is needed to make the hexagonal boron nitride particles moderately hydrophilic in order to enhance the dispersibility. On the other hand, since a main structure of the epoxy monomer is hydrophobic, it is considered that hexagonal boron nitride particles need to balance hydrophilicity and hydrophobicity. From the viewpoint of balancing such hydrophilicity and hydrophobicity, it is presumed that it is effective to make the polarity term of the surface energy of the hexagonal boron nitride particles 1 mN/m or more.

From the viewpoint of the dispersibility with respect to the epoxy monomer, the polarity term of the surface energy of the hexagonal boron nitride particles is more preferably 10 mN/m or more. From the viewpoint of improving the dispersibility in the epoxy resin composition, the polarity term of the surface energy of the hexagonal boron nitride particles is preferably from 1 mN/m to 50 mN/m, and more preferably from 10 mN/m to 50 mN/m.

The method of obtaining the polarity term of the surface energy of the hexagonal boron nitride particles is as follows.

The surface energy ($\gamma_S$) of the hexagonal boron nitride particles is represented by the sum of the surface energy dispersion term ($\gamma^d_S$) and the surface energy polarity term ($\gamma^p_S$) as in the following Formula (1).

$$\gamma_S = \gamma^d_S + \gamma^p_S \quad (1)$$

The polarity term ($\gamma^p_S$) of the surface energy of the hexagonal boron nitride particles can be obtained from the contact angles between two or more kinds of liquids and the hexagonal boron nitride particles by the following Formulae (2) and (3), the liquids whose values of both the dispersion term ($\gamma^d_L$) and the polarity term ($\gamma^p_L$) in the surface energy ($\gamma_L$) of the liquid are known. In Formula (3), $\theta$ represents the contact angle between the hexagonal boron nitride particle and the liquid.

$$\gamma_L = \gamma^d_L + \gamma^p_L \quad (2)$$

$$\gamma_L(1 + \cos\theta) = 2\sqrt{\gamma^d_L \gamma^d_S} + 2\sqrt{\gamma^p_L \gamma^p_S} \quad (3)$$

The polarity term of the surface energy of the hexagonal boron nitride particles is calculated as follows, for example, when water and n-hexadecane are used as a liquid whose surface energy is known.

When the dispersion term ($\gamma^d_L$) of the surface energy of water is 29.3 mN/m and the polarity term ($\gamma^p_L$) of the surface energy is 43.5 mN/m, substituting the values into the above Formula (3) yields the following Formula (4). In Formula (4), $\theta$ (water) indicates the contact angle between a hexagonal boron nitride particle and water.

$$72.8(1 + \cos\theta(\text{water})) = 2\sqrt{29.3\gamma^d_S} + 2\sqrt{43.5\gamma^p_S} \quad (4)$$

When the dispersion term ($\gamma^d_L$) of the surface energy of n-hexadecane is 27.6 mN/m and the polarity term ($\gamma^p_L$) of the surface energy is 0 mN/m, substituting the values into the above Formula (3) yields the following Formula (5). In Formula (5), $\theta$ (hexadecane) indicates the contact angle between a hexagonal boron nitride particle and n-hexadecane.

$$27.6(1 + \cos\theta(\text{hexadecane})) = 2\sqrt{27.6\gamma^d_S} \quad (5)$$

Therefore, measuring the contact angles with the hexagonal boron nitride particles and n-hexadecane and substituting the values into the above Formula (5) yields the dispersion term ($\gamma^d_S$) of the surface energy. Further, measuring the contact angle between the hexagonal boron nitride particles and water and substituting the value into the above Formula (4) yields the polarity term ($\gamma^p_S$) of the surface energy.

The two or more kinds of liquids used for determining the polarity term of the surface energy of the hexagonal boron nitride particles are not particularly limited as long as both values of the dispersion term ($\gamma^d_L$) and the polarity term ($\gamma^p_L$) are known. From the viewpoint of reducing measurement errors, at least two types of polar liquid and nonpolar liquid are preferably used.

Examples of the polar liquid include water, diiodomethane, tetrabromethane, tetrachloroethane, glycerin and formamide, and water is preferably used from the viewpoint that the value of the polarity term of the surface energy of water is high. Examples of the nonpolar liquid include n-hexadecane, n-tetradecane, n-dodecane, n-undecane, n-decane, n-nonane and n-octane, and n-hexadecane is preferably used from the viewpoint that the value of the dispersion term of the surface energy of n-hexadecane is high.

The "contact angle" herein referred to is the angle $\theta$ formed between a tangent of a droplet and a surface of a green compact of the hexagonal boron nitride particles at the end point of an interface between the droplet and the green compact. The green compact can be obtained by filling the hexagonal boron nitride particles in a 20 mmφ mold and pressing the particles with a pressure of 600 kgf/cm² (5,880 N/cm²) using a press having an average surface roughness (Ra) of 0.1 μm and a diameter of 19 mmφ. In the absence of such a device, the green compact can be obtained by filling the hexagonal boron nitride particles in a mold having a diameter of 10 mmφ or more and pressing the particles with a press having an average surface roughness (Ra) of 0.5 μm or less and having a diameter smaller than the diameter of the mold at a pressure of 500 kgf/cm² or more.

Hexagonal boron nitride particles having a polarity term of surface energy of 1 mN/m or more can be obtained, for example, by subjecting hexagonal boron nitride particles to an oxidation treatment. Examples of the oxidation treatment method include a method of heat treatment of hexagonal boron nitride particles at 150° C. or higher, a method of ultraviolet irradiation, a method of ozone treatment, a method of $O_2$ plasma treatment, a method of atmospheric pressure plasma treatment, and a method of chromic acid treatment. Among them, a heat treatment or an ultraviolet irradiation is preferable.

The heat treatment of the hexagonal boron nitride particles can be carried out by a general method. In the heat treatment, a general heating device used in the manufacturing technology of various chemical products such as hot plate, constant temperature oven, electric furnace, or firing furnace can be utilized. There is no particular limitation on the atmosphere of the heat treatment, but from the viewpoint of increasing the oxygen atom concentration on the surface of hexagonal boron nitride particles, the atmosphere is preferably an oxidizing atmosphere such as the atmosphere. The heating time is not particularly limited, and is preferably 1 minute or more, and more preferably 10 minutes or more from the viewpoint of decomposing organic impurities on the surface of the hexagonal boron nitride particles.

For example, an ultraviolet irradiation processing technology and an ultraviolet irradiation device used in a variety of chemical product manufacturing technologies can be utilized to irradiate hexagonal boron nitride particles with ultraviolet rays. Examples of the ultraviolet irradiation device include a high-pressure mercury lamp, a low-pressure mercury lamp, a deuterium lamp, a metal halide lamp, a xenon lamp, and a halogen lamp.

The ultraviolet ray used for irradiation preferably contains light having an ultraviolet region with a wavelength of from 150 nm to 400 nm, and may contain light of other wavelengths. From the viewpoint of decomposing organic impurities on the surface of hexagonal boron nitride particles, it is preferable to include light having a wavelength of from 150 nm to 400 nm.

The irradiation intensity as the ultraviolet irradiation condition is not particularly limited, and is preferably 0.5 mW/cm² or more. At this irradiation intensity, there is a tendency that an intended effect is more sufficiently exhibited. The irradiation time is preferably 10 seconds or more in order to sufficiently exhibit the intended effect.

The irradiation ultraviolet ray amount is defined by the irradiation intensity (mW/cm²)×the irradiation time (second), and, from the viewpoint of more fully exhibiting an intended effect, is preferably 100 mJ/cm² or more, more preferably 1,000 mJ/cm² or more, still more preferably 5,000 mJ/cm² or more, and particularly preferably 10,000 mJ/cm² or more. From the viewpoint of more suppressing a damage of the hexagonal boron nitride particles by ultraviolet irradiation, the irradiation ultraviolet ray amount is preferably 50,000 mJ/cm² or less. A preferable range of the irradiation ultraviolet ray amount is from 100 mJ/cm² to 50,000 mJ/cm², more preferably from 1,000 mJ/cm² to 50,000 mJ/cm², and still more preferably from 5,000 mJ/cm² to 50,000 mJ/cm².

The ultraviolet irradiation intensity is defined by the method described in the Examples described below.

In the ultraviolet irradiation treatment, for example, it is preferable to irradiate 100 mJ/cm² or more of light containing ultraviolet rays having a wavelength of from 150 nm to 400 nm to the hexagonal boron nitride particles.

When irradiating hexagonal boron nitride particles with ultraviolet rays, it is preferable to irradiate the entire hexagonal boron nitride particles as uniformly as possible with ultraviolet rays. Examples of a method of uniformly irradiating include a method of irradiating ultraviolet rays while stirring hexagonal boron nitride particles. The method of stirring hexagonal boron nitride particles during ultraviolet irradiation may be a method not using a stirring device such as a method of stirring with a stirring rod, a spatula, or a medicine spoon, a method of stirring by vibrating a container containing hexagonal boron nitride particles, or may be a method using a stirring device such as a vibration-type mixer, a ribbon-type mixer, or a paddle-type mixer during ultraviolet irradiation. From the viewpoint of uniform mixing, a stirring device is preferably used, and specifically, a stirring device such as a paddle type mixer is preferably used.

There is no limitation on the ultraviolet irradiation atmosphere, but from the viewpoint of increasing the oxygen atom concentration on the surface of hexagonal boron nitride particles, it is preferable to be in the presence of oxygen or in the presence of ozone.

A content of the hexagonal boron nitride particles in an epoxy resin composition is not particularly limited, and is preferably 50% by mass or more with respect to a total solid content constituting the epoxy resin composition from the viewpoint of thermal conductivity, and more preferably from 50% by mass to 95% by mass from the viewpoint of viscosity. The solid content of an epoxy resin composition means a component which is solid at room temperature (25° C.) among the components constituting the epoxy resin composition.

(Liquid Crystalline Epoxy Monomer)

The epoxy resin composition of the present embodiment contains a liquid crystalline epoxy monomer. The liquid crystalline epoxy monomer is a monomer having a so-called mesogen structure (a biphenyl group, a terphenyl group, a terphenyl analog group, an anthracene group, a group in which these are connected by an azomethine group or an ester group, or the like). When a liquid crystalline epoxy monomer reacts with a curing agent to form a resin matrix, a higher order structure (also referred to as periodic structure) derived from a mesogen structure is formed in a resin matrix.

The higher order structure referred to above means a state in which molecules are aligned in a resin matrix, for example, a state in which a crystal structure or a liquid crystal structure is present in a resin matrix. Existence of such a crystal structure or a liquid crystal structure can be directly confirmed, for example, by observation under a polarization microscope with crossed nicols, or by an X-ray scattering spectrum. Alternatively, existence of a crystal structure or a liquid crystal structure can be indirectly confirmed by decrease in a storaging elastic modulus change according to a temperature change, since the storaging elastic modulus change according to a temperature change decreases upon existence of such a crystal structure or a liquid crystal structure.

The epoxy resin composition of the present embodiment can form a resin matrix having a smectic domain by reacting a liquid crystalline epoxy monomer with a curing agent. Therefore, the epoxy resin composition of the present embodiment can exhibit high thermal conductivity by curing. The reason for this can be thought, for example, as follows.

When a liquid crystalline epoxy monomer reacts with a curing agent to form a resin matrix, a domain composed of a highly regular high-order structure derived from a mesogen structure of the liquid crystalline epoxy monomer is formed in the resin matrix. Due to the existence of this high-order structure, scattering of a phonon which is a heat conduction medium is suppressed, and the thermal conductivity is improved.

Examples of the high-order structures having high regularity derived from a mesogen structure include a nematic structure and a smectic structure. The nematic structure is a liquid crystal structure in which the major axes of the molecules are oriented in a uniform direction and has only orientational order. On the other hand, the smectic structure is a liquid crystal structure having a one-dimensional position order in addition to the orientational order so as to have a layer structure with a constant period. In the same domain of the smectic structure, the periodic direction of the layer structure is uniform. That is, the orderliness of molecules is higher in a smectic structure than in a nematic structure, and the thermal conductivity of a cured product is also higher in the case of exhibiting a smectic structure. Therefore, it is considered that the epoxy resin composition of the present embodiment can exhibit high thermal conductivity by curing.

From the viewpoint of the thermal conductivity, a ratio of a smectic domain in a cured product is preferably 60% by volume or more, more preferably 80% by volume or more with respect to the entire resin matrix.

The ratio of a smectic domain to the entire resin matrix can be easily measured by, for example, polishing a cured product to a thickness of 50 μm and observing with a polarizing microscope. Specifically, by polishing the cured product to a thickness of 50 μm, observing with a polarizing microscope (for example, product name: "OPTIPHOT2-POL" manufactured by Nikon Corporation), measuring the area of the smectic domain, and determining the percentage of the area of the entire field of view observed with a polarizing microscope, the ratio of the smectic domain to the entire resin matrix can be simply measured.

An example of a periodic structure in the smectic domain is illustrated in FIG. 1. FIG. 1 schematically illustrates a periodic structure derived from a mesogen structure 2 in a case in which a domain 1 formed around a scaly hexagonal boron nitride particle 3 is observed from a side face of a hexagonal boron nitride particle 3. From the viewpoint of the orientation property, as illustrated in FIG. 1, preferably, a periodic structure is formed in a direction intersecting with a side face ((100) crystal face 5) of the hexagonal boron nitride particle 3, and a periodic structure is formed in a direction along the front and back faces (a (001) crystal face 4) of hexagonal boron nitride 3.

Hexagonal boron nitride particles tend to form hydroxyl groups on the (100) crystal face but not on the (001) crystal face due to the nature of the crystal structure. A liquid crystalline epoxy monomer having a mesogen structure tends to form a periodic structure in a direction intersecting with a surface having many hydroxyl groups and to form a periodic structure in a direction along a surface having a low polarity term of the surface energy and few hydroxyl groups.

By using hexagonal boron nitride particles having an aspect ratio of 2 or more, the structure of FIG. 1 can be more easily formed. The reason is considered to be that when hexagonal boron nitride particles having an aspect ratio of 2 or more are used, the orientations of the hexagonal boron nitride particles present in an epoxy resin composition are easily aligned. In general, when the aspect ratio increases, a ratio of the (001) crystal face increases, and therefore, it is considered that a region needed for forming a periodic structure in a direction along the surface can be secured. By using hexagonal boron nitride particles having an aspect ratio of 2 to 7, both the (001) crystal face having few hydroxyl groups and the (100) crystal face having many hydroxyl groups can be sufficiently secured for forming the structure of FIG. 1, which is more preferable.

By subjecting hexagonal boron nitride particles to an oxidation treatment, there is a tendency to selectively form a hydroxyl group on the (100) crystal face without substantially changing the amount of hydroxyl groups on the (001) crystal face. Therefore, by utilizing the hexagonal boron nitride particles subjected to the oxidation treatment, in particular, hexagonal boron nitride particles having a surface energy polarity term of 1 mN/m or more, the structure of FIG. 1 is more likely to be formed.

The smectic domain preferably has a periodic structure having one cycle length of from 2 nm to 4 nm. When the one cycle length is from 2 nm to 4 nm, a higher thermal conductivity can be exhibited.

The length of one cycle in the periodic structure can be obtained by performing X-ray diffraction using a semi-cured product or a cured product of an epoxy resin composition as a measurement specimen under the following conditions using a wide-angle X-ray diffractometer (for example, product name: "RINT2500HL" manufactured by Rigaku Corporation), and converting the thus obtained diffraction angle into the following Bragg's equation.

(Measurement Conditions)
X-ray source: Cu
X-ray output: 50 kV, 250 mA
Divergence slit (DS): 1.0 degree
Scattering slit (SS): 1.0 degree
Receiving slit (RS): 0.3 mm
Scan speed: 1.0 degree/minute
Bragg's equation: $2d \cdot \sin \theta = n\lambda$ Here, d is one period length, $\theta$ is the diffraction angle, n is the reflection order, and $\lambda$ is the X-ray wavelength (0.15406 nm).

From the viewpoint of formation of a smectic structure, a liquid crystalline epoxy monomer preferably contains a monomer represented by the following Formula (I). The monomers represented by the following Formula (I) may be used singly, or in combination of two or more kinds thereof.

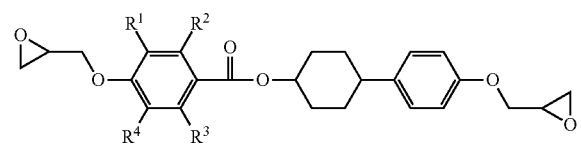

(I)

In the Formula (I), each of $R^1$ to $R^4$ independently represents a hydrogen atom or an alkyl group having from 1 to 3 carbon atoms. Each of $R^1$ to $R^4$ independently is preferably a hydrogen atom or an alkyl group having from 1 to 2 carbon atoms, more preferably a hydrogen atom or a methyl group, and still more preferably a hydrogen atom. Preferably, 2 to 4 out of $R^1$ to $R^4$ are hydrogen atoms, more preferably 3 or 4 are hydrogen atoms, and still more preferably all 4 are hydrogen atoms. When any one of $R^1$ to $R^4$ is an alkyl group having from 1 to 3 carbon atoms, at least one of $R^1$ and $R^4$ is preferably an alkyl group having from 1 to 3 carbon atoms.

Preferable examples of the monomer represented by Formula (I) are described in, for example, JP-A No. 2011-74366. Specifically, as the monomer represented by Formula (I), at least one monomer selected from the group consisting of 4-{4-(2,3-epoxypropoxy)phenyl}cyclohexyl-4-(2,3-epoxypropoxy)benzoate and 4-{4-(2,3-epoxypropoxy)phenyl}cyclohexyl-4-(2,3-epoxypropoxy)-3-methylbenzoate is preferable.

At least a part of some liquid crystalline epoxy monomers may be in the form of a prepolymer obtained by reaction with a curing agent or the like which will be described below. A liquid crystalline epoxy monomer having a mesogen group in its molecular structure, such as a liquid crystalline epoxy monomer represented by Formula (I), is generally easy to crystallize, and the solubility of such a monomer in a solvent is lower than those of other epoxy resin monomers in many cases. When at least a part of some liquid crystalline epoxy monomers are polymerized to prepare a prepolymer, crystallization is suppressed, and the formability of the epoxy resin composition tends to be improved.

From the viewpoint of moldability and adhesiveness, a content of the liquid crystalline epoxy monomer with respect to the total solid content of the epoxy resin composition is preferably from 10% by volume to 40% by volume, more preferably from 15% by volume to 35% by volume, and still more preferably from 15% by volume to 30% by volume.

Herein, a volume-based content of a liquid crystalline epoxy monomer with respect to the total solid content of an epoxy resin composition is determined by the following Formula.

Content (% by volume) of liquid crystalline epoxy monomer to total solid content={($Bw/Bd$)/(($Aw/Ad$)+($Bw/Bd$)+($Cw/Cd$)+($Dw/Dd$))}×100

Here, each variable is as follows.
Aw: mass composition ratio (% by mass) of hexagonal boron nitride particles
Bw: mass composition ratio (% by mass) of liquid crystalline epoxy monomer
Cw: mass composition ratio (% by mass) of curing agent
Dw: mass composition ratio (% by mass) of other optional components (excluding solvent)
Ad: specific gravity of hexagonal boron nitride particles
Bd: specific gravity of liquid crystalline epoxy monomer
Cd: specific gravity of curing agent
Dd: specific gravity of other optional components (excluding solvent)

The epoxy resin composition may further contain other epoxy monomers other than the liquid crystalline epoxy monomer as long as the properties are not greatly impaired. Examples of other epoxy monomers include: glycidyl ethers of phenol compounds such as bisphenol A, bisphenol F, bisphenol S, phenol novolac, cresol novolac, or resorcinol novolak; glycidyl ethers of alcohol compounds such as butanediol, polyethylene glycol, and polypropylene glycol; glycidyl esters of carboxylic acid compounds such as phthalic acid, isophthalic acid, and tetrahydrophthalic acid; glycidyl type (including methyl glycidyl type) epoxy monomer such as aniline and isocyanuric acid in which an active hydrogen bonded to a nitrogen atom is substituted with a glycidyl group; alicyclic epoxy monomer such as vinyl cyclohexene epoxide, 3,4-epoxycyclohexylmethyl-3,4-epoxycyclohexane carboxylate, and 2-(3,4-epoxy)cyclohexyl-5,5-spiro(3,4-epoxy)cyclohexane-m-dioxane, which are obtained by epoxidizing olefin bond in the molecule; epoxidized products of bis(4-hydroxy)thioether; glycidyl ethers of paraxylylene-modified phenolic resin, metaxylylene paraxylylene-modified phenolic resin, terpene modified phenolic resin, dicyclopentadiene modified phenolic resin, cyclopentadiene modified phenolic resin, polycyclic aromatic-ring-modified phenolic resin, and naphthalene-ring-containing phenolic resin; stilbene type epoxy monomer; and halogenated phenol novolak type epoxy monomer (among them, liquid crystalline epoxy monomers are excluded). The other epoxy monomers may be used singly, or in combination of two or more thereof.

A content of the other epoxy monomer is not particularly limited, and if the liquid crystalline epoxy monomer is 1 based on mass, the content is preferably 0.3 or less, more preferably 0.2 or less, and still more preferably 0.1 or less.

(Curing Agent)

The epoxy resin composition of the present embodiment contains a curing agent. The curing agent is not particularly limited as long as it is a compound capable of curing reaction with a liquid crystalline epoxy monomer. Specific examples of the curing agent include an amine curing agent, an acid anhydride curing agent, a phenol curing agent, a polymercaptan curing agent, a polyaminoamide curing agent, an isocyanate curing agent, and a blocked isocyanate curing agent. These curing agents may be used singly, or in combination of two or more kinds thereof.

From the viewpoint of forming a periodic structure of a semi-cured product or a cured product of an epoxy resin composition, as the curing agent, an amine curing agent or a phenol curing agent is preferable, a phenol curing agent is more preferable, and a phenol curing agent containing a phenol novolac resin is more preferable.

When the curing agent contains a phenol curing agent, the content of the phenolic curing agent is preferably 40 parts by mass or more, more preferably 60 parts by mass or more, and still more preferably 80 parts by mass or more, based on 100 parts by mass of the curing agent.

In a case in which the curing agent contains a phenolic curing agent, a curing accelerator may be used in combination if necessary. By using a curing accelerator in combination, an epoxy resin composition can be cured further sufficiently. The type of the curing accelerator is not particularly limited and may be selected from commonly used curing accelerators. Examples of the curing accelerator include an imidazole compound, a phosphine compound, and a borate salt compound.

A content of the curing agent in an epoxy resin composition can be, if appropriate, set in consideration of the kind of the curing agent to be blended and the physical properties of a liquid crystalline epoxy monomer.

Specifically, the equivalent number of the functional group of the curing agent with respect to 1 equivalent of the epoxy group in the liquid crystalline epoxy monomer is preferably from 0.005 equivalents to 5 equivalents, more preferably from 0.01 equivalents to 3 equivalents, and even more preferably from 0.5 equivalents to 1.5 equivalents. When the equivalent number of the functional group of the curing agent is 0.005 equivalents or more with respect to 1 equivalent of the epoxy group, the curing rate of the liquid crystalline epoxy monomer tends to be further improved. When the equivalent number of the functional group of the curing agent is 5 equivalents or less with respect to 1 equivalent of the epoxy group, the curing reaction tends to be more appropriately controllable.

Herein, for example, when a phenol curing agent is used as a curing agent, the chemical equivalent represents the equivalent number of hydroxyl groups of the phenol curing agent to 1 equivalent of the epoxy group, and when an amine curing agent is used as a curing agent, the chemical equivalent represents the equivalent number of active hydrogen of the amine curing agent to 1 equivalent of the epoxy group.

(Other Components)

A solvent may be contained in the epoxy resin composition of the present embodiment for dissolving or dispersing a liquid crystalline epoxy monomer or a curing agent when it is a solid, or for decreasing the viscosity when it is a liquid.

As the solvent, an organic solvent such as acetone, isobutyl alcohol, isopropyl alcohol, isopentyl alcohol, ethyl ether, ethylene glycol monoethyl ether, xylene, cresol, chlorobenzene, isobutyl acetate, isopropyl acetate, isopentyl acetate, ethyl acetate, methyl acetate, cyclohexanol, cyclohexanone, 1,4-dioxane, dichloromethane, styrene, tetrachlorethylene, tetrahydrofuran, toluene, n-hexane, 1-butanol, 2-butanol, methanol, methyl isobutyl ketone, methyl ethyl ketone, methyl cyclohexanol, methyl cyclohexanone, chloroform, carbon tetrachloride, or 1,2-dichloroethane which is commonly used in manufacturing technologies of a variety of chemical products can be used.

When too much residual solvent is left after curing, formation of a higher order structure may be may inhibited. For this reason, when a solvent having a high boiling point is used, preferably, it is mixed with a low boiling point solvent and the amount of the residual solvent is adjusted.

The epoxy resin composition of the present embodiment may contain ceramic particles other than hexagonal boron nitride particles, a coupling agent, a dispersant, an elastomer, and the like.

Examples of the ceramic particles other than the hexagonal boron nitride particles include alumina particles, silica particles, magnesium oxide particles, aluminum nitride particles, and silicon nitride particles, and alumina particles are preferable. The alumina particles preferably contain highly crystalline alumina particles, and more preferably contain α-alumina particles. When alumina particles are used in combination, a smectic structure tends to be exhibited, and the thermal conductivity of a cured product tends to be improved. The reasons are as follows.

Since many hydroxyl groups are present on the surface of the alumina particles, the liquid crystalline epoxy monomer tends to be aligned perpendicular to the alumina particles. By this, the thermal conductivity in the thickness direction of a cured product of an epoxy resin composition is improved. Further, the existence of the alumina particles facilitates the orientation of the boron nitride particles in the thickness direction, and therefore, the thermal conductivity in the thickness direction of a cured product of an epoxy resin composition is improved. Furthermore, the alumina particles play a role as a nucleus for exhibition of a smectic structure, and the smectic structure easily develops.

When the epoxy resin composition contains alumina particles, a content of alumina particles with respect to a total amount of hexagonal boron nitride particles and alumina particles is preferably from 1% by mass to 70% by mass, and more preferably from 10% by mass to 50% by mass.

(Preparation Method of Epoxy Resin Composition)

As a method of preparing an epoxy resin composition of the present embodiment, a commonly-used method of preparing a resin composition can be used without particular limitation. In a method of mixing hexagonal boron nitride particles, a liquid crystalline epoxy monomer, a curing agent, and other components used if necessary, mixing can be carried out by, if appropriate, combining dispersing machines such as ordinary stirrers, milling machines, triple rollers, or ball mills. Dispersing or dissolving can be carried out by adding an appropriate solvent.

Specifically, for example, an epoxy resin composition can be obtained by mixing other components as needed with hexagonal boron nitride particles, a liquid crystalline epoxy monomer, and a curing agent dissolved or dispersed in an appropriate solvent.

(Applications or the Like of Epoxy Resin Composition)

The epoxy resin composition of the present embodiment has high orientation property of a liquid crystalline epoxy monomer, and is excellent in thermal conductivity and dielectric strength when cured. Therefore, the epoxy resin composition of the present embodiment can be suitably used as a heat dissipation material for heat-generating electronic components (for example, integrated circuit (IC) chip or printed circuit board) of a variety of electric and electronic devices. Specifically, the epoxy resin composition of the present embodiment can be used for thermally-conductive material precursors such as B-stage sheets or prepregs, or heat dissipation materials such as laminates, metal substrates, or printed circuit boards.

<Thermally-Conductive Material Precursor>

The thermally-conductive material precursor of the present embodiment is a semi-cured product of the epoxy resin composition of the present embodiment. By using the thermally-conductive material precursor, a heat dissipation material having excellent handling properties, and high thermal conductivity and dielectric strength can be obtained.

Examples of the thermally-conductive material precursor include a B-stage sheet and a prepreg which will be described below.

As described above, a semi-cured product of an epoxy resin composition contains a resin matrix having a smectic domain. By including a resin matrix having a smectic domain, a higher thermal conductivity can be exhibited.

In the smectic domain, a periodic structure is formed in the direction intersecting with the (100) crystal face of a hexagonal boron nitride particle, and a periodic structure is formed in the direction along the (001) crystal face of the hexagonal boron nitride particle.

The smectic domain preferably has a periodic structure having one cycle length of from 2 nm to 4 nm. When one cycle length is from 2 nm to 4 nm, a higher thermal conductivity can be exhibited.

<B-Stage Sheet>

A B-stage sheet of the present embodiment is a sheet-shaped semi-cured product of the epoxy resin composition of the present embodiment. The B-stage sheet can be obtained, for example, by molding an epoxy resin composition into a sheet and semi-curing the sheet. Since the B-stage sheet is a semi-cured product of the epoxy resin composition of the present embodiment, a B-stage sheet excellent in thermal conductivity and dielectric strength after curing can be obtained. In particular, since a resin matrix in a B-stage sheet has a smectic domain, the B-stage sheet excellent in thermal conductivity after curing can be obtained.

Here, the term "semi-curing" refers to a state generally referred to as "B-stage state", and means a state in which the viscosity at 100° C. falls to $10^2$ Pa·s to $10^3$ Pa·s, while the viscosity at normal temperature (25° C.) is $10^4$ Pa·s to $10^5$ Pa·s. The term "B-stage" is defined in JIS K 6900:1994 or ISO 472:1988. The viscosity can be measured with a torsion-type dynamic viscoelasticity measuring device or the like.

The B-stage sheet can be produced, for example, by applying (coating) an epoxy resin composition on a support, drying the composition to produce a resin sheet, and semi-curing the resin sheet. There is no particular limitation on the method of applying and drying an epoxy resin composition, and commonly used methods can be, if appropriate, selected. Specifically, examples of the application method include a comma coating method, a die coating method, and a dip coating method.

In the case of a batch treatment, a drying method of the epoxy resin composition, includes a method using a box-type hot air drier or the like can be mentioned, and in the case of a continuous treatment with a coating machine, a drying method includes a method using a multi-stage hot air dryer or the like. There is no particular limitation on drying conditions, and in the case of using a hot-air dryer, from the viewpoint of preventing swelling of the coating of the epoxy resin composition, a step of heat treating with warm air in a temperature range lower than the boiling point of a solvent is preferably included.

There is no particular limitation on the method of semi-curing a resin sheet, and commonly used methods can be, if appropriate, selected. For example, by heat treating a resin sheet, an epoxy resin composition can be semi-cured. The heat treatment method of semi-curing is not particularly limited.

A temperature range for semi-curing a resin sheet can be, if appropriate, selected according to the type or the like of a liquid crystalline epoxy monomer contained in an epoxy resin composition. From the viewpoint of the strength of the B-stage sheet, preferably, a curing reaction of a liquid crystalline epoxy monomer is slightly advanced by a heat treatment. The temperature range of a heat treatment is preferably from 80° C. to 180° C., and more preferably from 100° C. to 160° C. A time of the heat treatment for semi-curing is not particularly limited, and can be, if appropriate, selected from the viewpoints of the curing rate of a resin sheet, the fluidity of a resin, and the adhesiveness. The time of the heat treatment is preferably from 1 minute to 30 minutes, and more preferably from 1 minute to 10 minutes.

A resin sheet may be pressurized during the heat treatment for semi-curing, and a pressurizing condition is not particularly limited. The pressurizing condition is usually in the range of from 0.5 MPa to 15 MPa, and preferably pressure is applied in the range of from 1.0 MPa to 10 MPa. For the heat treatment and the pressurizing treatment, a vacuum press or the like is preferably used.

An average thickness of the B-stage sheet can be, if appropriate, selected according to the purpose, and can be, for example, from 50 μm to 500 μm, and from the viewpoints of thermal conductivity, electrical insulation, and flexibility, the average thickness is preferably from 80 μm to 300 μm.

A B-stage sheet can also be produced by hot pressing while layering two or more resin sheets (a sheet-shaped molded article of an epoxy resin composition before curing).

As described above, the B-stage sheet includes a resin matrix having a smectic domain. In the smectic domain, a periodic structure is formed in the direction intersecting with the (100) crystal face of a hexagonal boron nitride particle, and a periodic structure is formed in the direction along the (001) crystal face of the hexagonal boron nitride particle.

The smectic domain preferably has a periodic structure having one cycle length of from 2 nm to 4 nm. When one cycle length is from 2 nm to 4 nm, a higher thermal conductivity can be exhibited.

<Prepreg>

The prepreg of the present embodiment has a fiber substrate and a semi-cured product of the epoxy resin composition of the present embodiment impregnated in the fiber substrate. The prepreg may have another layer such as a protective film if necessary. Since the prepreg has a semi-cured product of the epoxy resin composition of the present embodiment, a prepreg excellent in thermal conductivity and dielectric strength after curing can be obtained.

The fiber substrate constituting a prepreg is not particularly limited as long as the material is a fiber substrate used in manufacturing a metal foil-clad laminate or a multilayer printed circuit board. Specifically, a fiber substrate such as a woven fabric or a nonwoven fabric is used. However, when an extremely dense fiber material is used as the fiber substrate, hexagonal boron nitride particles are clogged in gaps of the fibers, which may make it difficult to impregnate an epoxy resin composition, and therefore, the mesh size of the fiber substrate is preferably at least 5 times the volume average particle diameter of the hexagonal boron nitride particles.

Examples of the material of the fiber substrate include inorganic fibers such as glass, alumina, boron, silica alumina glass, silica glass, tyranno, silicon carbide, silicon nitride, or zirconia; organic fibers such as aramid, polyether ether ketone, polyether imide, polyethersulfone, or cellulose; and mixed fiber substrates thereof. In particular, a woven fabric of glass fiber is preferably used. As a result, a flexible arbitrarily foldable printed circuit board can be obtained. Further, dimensional changes of a printed circuit board due to temperature, moisture absorption, or the like during the manufacturing process can also be reduced.

An average thickness of the fiber substrate is not particularly limited and is preferably 30 μm or less from the viewpoint of imparting more favorable flexibility, and is more preferably 15 μm or less from the viewpoint of the impregnating property of an epoxy resin composition. A lower limit of the average thickness of the fiber substrate is not particularly limited, and is usually about 5 μm.

In the prepreg, the impregnation rate of the epoxy resin composition is preferably from 50% by mass to 99.9% by mass with respect to a total mass of the fiber substrate and the epoxy resin composition.

The prepreg can be produced, for example, by impregnating a fiber substrate with an epoxy resin composition prepared in the same manner as described above and removing a solvent by heating at from 80° C. to 180° C. The solvent residual ratio in the prepreg is preferably 2.0% by mass or less, more preferably 1.0% by mass or less, and still more preferably 0.7% by mass or less. The solvent residual ratio is determined from the mass change of a prepreg cut into 40 mm squares before and after drying in a constant temperature oven preheated to 190° C. for 2 hours.

A drying time for removing the solvent by heat treatment is not particularly limited. There is no particular limitation on the method of impregnating the fiber substrate with the epoxy resin composition, and for example, a method of applying (coating) using a coating machine can be mentioned. In detail, a vertical coating method in which a fiber substrate is passed through an epoxy resin composition and pulled up, a horizontal coating method in which an epoxy resin composition is applied on a supporting film and then pressed with a fiber substrate to be impregnated with a fiber substrate. From the viewpoint of suppressing the uneven distribution of hexagonal boron nitride particles in the fiber substrate, a horizontal coating method is suitable.

In the prepreg, the epoxy resin composition impregnated in the fiber substrate is semi-cured to be in a B-stage state. The B-stage state in the prepreg is the same as the B-stage state in a B-stage sheet, and the same conditions can be applied to the method of forming the B-stage.

The prepreg may be used after smoothing the surface in advance before layering or sticking to a substrate by heating and pressurizing treatment with a press, a roll laminator, or the like. The method of heating and pressurizing treatment is the same as the method described above for the B-stage sheet. Conditions of the heating temperature and the pressing pressure in the heating and pressurizing treatment of the prepreg are also the same as the conditions mentioned in the heat treatment and pressurizing treatment of the B-stage sheet.

An average thickness of the prepreg can be, if appropriate, selected according to the purpose, and can be, for example, from 50 μm to 500 μm, and from the viewpoint of thermal conductivity and flexibility, the average thickness is preferably from 60 μm to 300 μm.

The prepreg can also be produced by layering two or more prepregs, and hot pressing them.

<Heat Dissipation Material>

A heat dissipation material of the present embodiment is a cured product of the epoxy resin composition of the present embodiment. Specific examples of the heat dissipation material include a laminate, a metal substrate, and a printed circuit board which will be described below. Since the heat dissipation material contains a cured product of the epoxy resin composition of the present embodiment, the heat dissipation material has excellent thermal conductivity and dielectric strength.

As described above, the cured product of the epoxy resin composition includes a resin matrix having a smectic domain. By including a resin matrix having a smectic domain, higher thermal conductivity can be exhibited.

In the smectic domain, a periodic structure is formed in the direction intersecting with the (100) crystal face of a hexagonal boron nitride particle, and a periodic structure is formed in the direction along the (001) crystal face of the hexagonal boron nitride particle.

The smectic domain preferably has a periodic structure having one cycle length of from 2 nm to 4 nm. When one cycle length is from 2 nm to 4 nm, a higher thermal conductivity can be exhibited.

<Laminate>

The laminate of the present embodiment includes: an adherend; and a cured layer of at least one resin-containing layer selected from the group consisting of a resin layer (resin sheet) formed from the epoxy resin composition of the present embodiment, the B-stage sheet of the present embodiment, and the prepreg of the present embodiment, disposed on the adherend. By having a cured layer formed from the epoxy resin composition of the present embodiment, a laminate excellent in thermal conductivity and dielectric strength can be obtained.

Examples of the adherend include a metal foil and a metal plate. Specific examples of the adherend include a metal foil and a metal plate in a metal substrate which will be described below. The adherend may be disposed on only one side or both sides of a cured layer.

In the laminate, the cured layer may have a single layer structure having a cured layer of a resin-containing layer which is a resin layer formed from an epoxy resin composition, a B-stage sheet or a prepreg, or may have a layered structure having two or more layers.

When the cured layer has a layered structure of two or more layers, the structure may be in any of a faun having two or more resin layers formed from an epoxy resin composition, a form having two or more B-stage sheets, and a form having two or more prepregs. The structure may have a form of combining two or more kinds selected from the group consisting of a resin layer formed from an epoxy resin composition, a B-stage sheet, and a prepreg.

For example, the laminate can be obtained by coating an epoxy resin composition on an adherend to form a resin layer, curing the resin layer by heat treatment and pressure treatment, and bringing the resin layer into close contact with the adherend. Alternatively, the laminate can be obtained by preparing a resin sheet, a B-stage sheet, or a prepreg layered on an adherend, subjecting it to a heat treatment and a pressure treatment to cure the resin sheet, the B-stage sheet, or the prepreg, and bringing it into close contact with the adherend.

There is no particular limitation on a curing method of curing a resin layer (resin sheet), a B-stage sheet, and a prepreg formed from an epoxy resin composition. For example, curing is preferably performed by a heat treatment and a pressurizing treatment. A heating temperature in the heat treatment and pressurizing treatment is not particularly limited. The heating temperature is usually in the range of 100° C. to 250° C., and preferably, in the range of from 130° C. to 230° C. Pressurizing conditions in the heat treatment and the pressure treatment are not particularly limited. The pressurizing condition is usually in the range of from 1 MPa to 10 MPa, and preferably in the range of from 1 MPa to 5 MPa. For the heat treatment and the pressure treatment, a vacuum press or the like is preferably used.

An average thickness of a cured layer of a resin-containing layer which is a resin layer formed from an epoxy resin composition, a B-stage sheet or a prepreg is preferably 500 μm or less, and more preferably from 100 μm to 300 μm. When the average thickness is 500 μm or less, the cured layer is excellent in flexibility and occurrence of cracks during bending processing tends to be suppressed. When the average thickness is 300 μm or less, the occurrence of cracks during bending processing tends to be further suppressed. When the average thickness is 100 μm or more, the workability is excellent.

<Metal Substrate>

The metal substrate of the present embodiment includes a metal foil; a metal plate; and a cured layer of at least one resin-containing layer selected from the group consisting of a resin layer formed from the epoxy resin composition of the present embodiment, the B-stage sheet of the present embodiment, and the prepreg of the present embodiment, disposed between the metal foil and the metal plate. By having a cured layer formed from the epoxy resin composition of the present embodiment, a metal substrate excellent in thermal conductivity and dielectric strength can be obtained.

The metal foil is not particularly limited and may be, if appropriate, selected from commonly used metal foils. Specifically, gold foil, copper foil, aluminum foil, and the like can be mentioned, and copper foil is generally used. A thickness of the metal foil may be from 1 μm to 200 μm, and a suitable thickness can be selected according to the electric power to be used.

As the metal foil, a composite foil having a three-layer structure in which a layer such as nickel, nickel-phosphorus alloy, nickel-tin alloy, nickel-iron alloy, lead, or lead-tin alloy is an intermediate layer, and a copper layer of from 0.5 μm to 15 μm and a copper layer of from 10 μm to 150 μm are disposed on both surfaces of the intermediate layer may be used, and a composite foil having a two-layer structure in which an aluminum foil and a copper foil are combined can also be used.

The metal plate is preferably made of a metal material having a high thermal conductivity and a large heat capacity. Specific examples of the material include copper, aluminum, iron, and an alloy used for a lead frame.

The metal plate is not particularly limited, and can be, if appropriate, selected from commonly used metal plates. For example, an aluminum plate is used as the metal plate when priority is given to weight reduction or workability, and a copper plate is used as the metal plate when priority is given to heat dissipation, and the material can be selected according to purposes.

An average thickness of the metal plate can be, if appropriate, selected depending on the application, and is not particularly limited. From the viewpoint of workability, the average thickness of the metal plate is preferably from 0.5 mm to 5 mm.

From the viewpoint of increasing productivity, it is preferable that the metal plate is produced to have a size larger than a needed size, and after an electronic component is mounted, the plate is cut into a size to be used. Therefore, it is desirable that the metal plate used for a metal substrate has excellent cutting processability.

When aluminum is used as the metal plate, aluminum or an alloy containing aluminum as a main component can be used as the material. Many kinds of aluminum or alloys containing aluminum as a main component are available depending on their chemical composition and heat treatment conditions. Among them, a type having high processability such as easy cutting and excellent in strength is preferably selected.

In the metal substrate, the cured layer may have a single layer structure having a cured layer of a resin-containing layer which is a resin layer formed from an epoxy resin composition, a B-stage sheet or a prepreg, or may have a layered structure having two or more layers.

When the cured layer has a layered structure of two or more layers, the structure may be in any of a form having two or more resin layers formed from an epoxy resin composition, a form having two or more B-stage sheets, and a form having two or more prepregs. The structure may have a form of combining two or more kinds selected from the group consisting of a resin layer formed from an epoxy resin composition, a B-stage sheet, and a prepreg.

<Printed Circuit Board>

The printed circuit board of the present embodiment includes: a wiring layer; a metal plate; and a cured layer of at least one resin-containing layer selected from the group consisting of a resin layer formed from the epoxy resin composition of the present embodiment, the B-stage sheet of the present embodiment, and the prepreg of the present embodiment, disposed between the wiring layer and the metal plate. By having a cured layer formed from the epoxy resin composition of the present embodiment, a printed circuit board excellent in thermal conductivity and dielectric strength can be obtained.

The wiring layer can be manufactured by circuit processing the metal foil of the above-described metal substrate. For circuit processing of a metal foil, a commonly used photolithography method can be applied.

Examples of the metal plate include the same metal plate as used for the above-described metal substrate, and a preferred aspect is also the same.

Examples of a preferred embodiment of the printed circuit board include the same as the printed circuit board described in paragraph [0064] of JP-A No. 2009-214525 and paragraphs [0056] to [0059] of JP-A No. 2009-275086.

EXAMPLES

The present invention will be described in more details below by way of Examples, provided that the present invention be not restricted in any way by the following Examples. Meanwhile, the expressions of "part" and "%" herein are by mass, unless otherwise specified.

Synthesis Example 1

After weighing 105 g (0.95 mol) of resorcinol and 5 g (0.05 mol) of catechol as a phenol compound, 0.11 g of oxalic acid (0.1% by mass based on phenol compound) as a catalyst, and 15 g of methanol as a solvent in a separable flask purged with nitrogen, the content was stirred and 30 g of formalin (about 0.33 mol, molar ratio of formalin (P) and phenol compound (F): P/F=0.33) was added thereto while cooling with an oil bath so as to be 40° C. or lower. After stirring for 2 hours, water and methanol were distilled off under reduced pressure while warming the oil bath to 100° C. After confirming that water and methanol no longer distilled out, a content of a phenol novolac resin was adjusted to 50% by mass using cyclohexanone to obtain a phenol curing agent solution.

The number average molecular weight of the phenol novolak resin obtained by molecular weight measurement by gel permeation chromatography (GPC) was 484 and the number of repeating unit n was 3.9 on average. The monomer content ratio was 40% by mass. As a result of $^1$H-NMR measurement, it was found that 2.1 hydroxyl groups were contained in the repeating unit on average. The hydroxyl group equivalent weight was 62 g/eq.

Example 1

An agglomerate of scaly hexagonal boron nitride particles (aspect ratio: 2.7, volume average particle diameter: 2.5 trade name: "SP-3" manufactured by Denki Kagaku Kogyo Co., Ltd.) (hereinafter also referred to as "boron nitride particle 1"), a liquid crystalline epoxy monomer (4-{4-(2,3-epoxypropoxy)phenyl}cyclohexyl-4-(2,3-epoxypropoxy) benzoate, liquid crystalline epoxy monomer represented by Formula (I) (hereinafter also referred to as "resin 1"), a curing agent (phenol curing agent solution prepared in Synthesis Example 1), a curing accelerator (triphenylphosphine), and a solvent (cyclohexanone/methyl ethyl ketone=⅓ (mass ratio)) were mixed to prepare an epoxy resin composition.

The blending amount of the liquid crystalline epoxy monomer and the curing agent was adjusted so that the ratio of the equivalent number of epoxy groups of the liquid crystalline epoxy monomer to the equivalent number of hydroxyl groups of the curing agent was 1:1. The addition amount of hexagonal boron nitride particles was adjusted so that the content of hexagonal boron nitride particles in the cured epoxy resin composition (corresponding to the total solid content) was 60% by mass. Further, the blending amount of the curing accelerator was adjusted to 0.8% by mass in the epoxy resin composition, and the blending amount of the solvent was adjusted so that the viscosity of the epoxy resin composition was 300 mPa·s.

After coating the prepared epoxy resin composition on a polyethylene terephthalate (PET) film having a thickness of 75 μm with a thickness of 300 μm, the coated epoxy resin composition was sandwiched with other PET films and vacuum pressed at 140° C. and 1 MPa for 2 minutes to obtain a B-stage sheet.

The diffraction angle derived from the periodic structure of the B-stage sheet which is a semi-cured product of the epoxy resin composition was measured using a wide-angle X-ray diffractometer (product name: "RINT2500HL" manufactured by Rigaku Corporation).

In detail, the diffraction angle was measured with Cu as the X-ray source, X-ray output at 50 kV, 250 mA, divergence slit (DS) as 1.0 degree, scattering slit (SS) as 1.0 degree, receiving slit (RS) as 0.3 mm, and scanning speed as 1.0 degree/min.

The measured diffraction angle was converted into a length of one period (cycle length) by the following Bragg's equation.

$$2d \cdot \sin\theta = n\lambda \qquad \text{Bragg's equation:}$$

Here, d is the length of one period, θ is the diffraction angle, n is the reflection order, and λ is the X-ray wavelength (0.15406 nm).

PET films on both sides of the obtained B-stage sheet were peeled off, the peeled B-stage sheet was sandwiched by copper foils (product name: "GTS" manufactured by Furukawa Electric Co., Ltd.) roughened on the surfaces instead, and the sandwiched sheet was press-bonded to the copper foils by vacuum pressing at 180° C. This was further heat-treated at 140° C. for 2 hours and then heat-treated at 190° C. for 2 hours to be cured to obtain a sheet-shaped copper-bonded cured product.

The copper foils on both sides of the obtained copper-bonded cured product were removed by acid etching using a mixed solution of 200 g/L ammonium persulfate and 5 mol/L sulfuric acid to obtain a sheet-shaped epoxy resin cured product.

The obtained sheet-shaped epoxy resin cured product was cut into a 1 cm square and used as a test piece for measuring thermal diffusivity. Thermal diffusivity of the cut test piece was measured using a flash method apparatus (product name: "NETZSCH, nanoflash LFA447" manufactured by Bruker AXS GmbH). By multiplying the measurement result by the density measured by the Archimedes method and the specific heat measured by differential scanning calorimetry (DSC) method, the thermal conductivity in the thickness direction of the cured epoxy resin sheet was obtained.

The obtained sheet-shaped epoxy resin cured product was immersed in oil and the dielectric breakdown electric field at room temperature (25° C.) was measured using a dielectric breakdown tester (product name: "DAC-6032C" manufactured by Soken Electric Co., Ltd.). Measurement was carried out by sandwiching a sheet-shaped epoxy resin cured product with cylindrical electrodes having a diameter of 10 mm, applying a current until a dielectric breakdown was made under conditions of a boosting speed of 500 V/s, an alternating current of 50 Hz, and a cut-off current of 10 mA.

The handling property of the obtained sheet-shaped epoxy resin cured product was evaluated as follows. In general, when handling is poor, the product can not be formed into a sheet in some cases. Even when molding is possible, voids and color unevenness tend to occur in the cured product formed into a sheet. Accordingly, from the viewpoints of the possibility of molding according to the method described in Example 1, and the presence or absence of voids and color unevenness due to visual recognition of a sheet-shaped cured epoxy resin product, the handling property of the sheet-shaped epoxy resin cured product was evaluated according to the following evaluation criteria:

A: Molding is possible when molded by the method described in Example 1, and a region without voids and color irregularities exists in an area of 5 cm×5 cm or more in a sheet-shaped cured product.

B: Molding is possible when molded by the method described in Example 1, but a region without voids and color irregularities does not exist in an area of 5 cm×5 cm or more in a sheet-shaped cured product.

C: Molding is not possible when molded by the method described in Example 1.

The resultant sheet-shaped epoxy resin cured product was polished with sandpaper to be processed to a thickness of 50 μm and observed with a polarizing microscope (product name: "OPTIPHOT2-POL" manufactured by Nikon Corporation) to check the presence or absence of a domain and the presence or absence of a smectic structure. The area of the smectic domain was measured, and the percentage of the smectic domain to the entire resin matrix was measured by determining the percentage of the area of the entire field of view observed with a polarizing microscope.

Further, the diffraction angle derived from the periodic structure of the obtained sheet-shaped epoxy resin cured product was measured in the same manner as in the case of the B-stage sheet, and converted into a length of one period (cycle length) by Bragg's equation.

In order to simply investigate the periodic structure of the epoxy resin cured product on the surface of the boron nitride particle 1, on a sintered substrate of the boron nitride particles 1, the epoxy resin composition was cured by heat treatment at 150° C. for 20 minutes to obtain a cured epoxy resin. The presence or absence of domains in the epoxy resin cured product was confirmed in the same manner as described above. Since the boron nitride particles 1 have a high aspect ratio, (001) crystal faces tend to be largely exposed on the surface of the sintered substrate. As a result, a periodic structure was formed in the direction along the surface of the sintered substrate.

On the other hand, the epoxy resin composition was similarly cured on an alumina substrate to obtain an epoxy resin cured product. The presence or absence of domains in the epoxy resin cured product was confirmed in the same manner as described above. As a result, a periodic structure was formed in a direction intersecting with the surface of the alumina substrate. This is thought to be due to the hydroxyl group on the alumina surface.

Here, since the hexagonal boron nitride particles have a feature that there are few functional groups on the (001) face and many functional groups on the (100) face, it can be estimated that a periodic structure is formed in the intersecting direction with respect to a (100) face with many functional groups.

A polarity term of the surface energy of the boron nitride particles 1 was calculated as follows. The boron nitride particles 1 were placed in an adapter female-type (20 mm φ) for hand press, and pressed at a pressure of 600 kgf/cm$^2$ (5,880 N/cm$^2$) using an adapter male-type (19 mmφ) for hand press to obtain a green compact. After removing the adapter male-type for hand press, the contact angle between the green compact and water and the contact angle between the green compact and n-hexadecane were measured with a contact angle measuring device (Kyowa Interface Science Co., Ltd., device name: "FACE CONTACT ANGLE METER CAD") under conditions of 25° C. and 50% humidity in a state in which the green compact was in the adapter female-type for hand press.

From the measured value of the contact angle, the polarity term of the surface energy was obtained using the above-described Formulae (4) and (5). More specifically, the dispersion term ($\gamma^d_S$) of the surface energy is obtained by substituting the contact angle between the green compact and n-hexadecane into Formula (5), and further, by substituting the contact angle between the green compact and water into Formula (4), the polarity term ($\gamma^p_S$) of the surface energy was obtained.

Example 2

An epoxy resin composition was prepared by the same manner as described in Example 1, except that α-alumina particles (product name: "AA-18" manufactured by Sumitomo Chemical Co., Ltd.) were used in addition to boron nitride particle 1, and contents of boron nitride particle 1 and α-alumina particles were adjusted so as to be respectively 60% by mass and 10% by mass with respect to a cured epoxy resin compound (corresponding to a total solid content). By using the prepared epoxy resin composition, a B-stage sheet and an epoxy resin cured product were produced in the same manner as in Example 1. Then, in the same manner as in Example 1, the length (cycle length) of one period of the periodic structure, the thermal conductivity, the dielectric breakdown electric field, the presence or absence of the domain, the presence or absence of the smectic structure, the ratio of the smectic domain to the entire resin matrix, and the handling properties of the sheet were confirmed.

Example 3

The boron nitride particles 1 were subjected to a heat treatment for 10 minutes in a constant temperature oven at 250° C. in the air atmosphere in advance. Regarding the boron nitride particles 1 after the heat treatment, the polarity term of the surface energy were calculated in the same manner as in Example 1.

An epoxy resin composition was prepared by the same manner as described in Example 1, except that the boron nitride particles 1 after the heat treatment were used. By using the prepared epoxy resin composition, a B-stage sheet and an epoxy resin cured product were produced in the same manner as in Example 1. Then, in the same manner as in Example 1, the length (cycle length) of one period of the periodic structure, the thermal conductivity, the dielectric breakdown electric field, the presence or absence of the domain, the presence or absence of the smectic structure, the ratio of the smectic domain to the entire resin matrix, and the handling properties of the sheet were confirmed.

Example 4

With respect to the boron nitride particles 1, ultraviolet rays were irradiated for 30 minutes while stirring under an atmospheric atmosphere using a low-pressure mercury lamp of 200 W in advance using desktop-type optical surface treatment apparatus (product name: "PHOTO SURFACE PROCESSOR PL21-200" manufactured by Sen Lights Corporation). Regarding the boron nitride particles 1 after the ultraviolet irradiation, the polarity term of the surface energy were calculated in the same manner as in Example 1.

An epoxy resin composition was prepared in the same manner as in Example 1 except that the boron nitride particles 1 after ultraviolet irradiation were used. By using the prepared epoxy resin composition, a B-stage sheet and an epoxy resin cured product were produced in the same manner as in Example 1. Then, in the same manner as in Example 1, the length (cycle length) of one period of the periodic structure, the thermal conductivity, the dielectric breakdown electric field, the presence or absence of the domain, the presence or absence of the smectic structure, the ratio of the smectic domain to the entire resin matrix, and the handling properties of the sheet were confirmed.

The irradiation intensity of ultraviolet rays was determined as the average irradiation intensity by measuring an amount of light having a wavelength of 254 nm using an accumulated UV meter (product name: "UIT-150" manufactured by Ushio Inc.). More specifically, an accumulated UV meter was placed in the surface treatment apparatus to measure the irradiation intensity, and the value displayed on the meter was recorded every 10 seconds. A sum of the recorded values was divided by an ultraviolet irradiation time to obtain the average irradiation intensity.

Example 5

The boron nitride particles 1 and α-alumina particles were subjected to a heat treatment in a constant temperature oven at 150° C. for 10 minutes in the air atmosphere, and further irradiated with ultraviolet light for 30 minutes with a low pressure mercury lamp of 200 W while stirring in the atmospheric atmosphere using a desktop-type optical surface treatment apparatus (product name: "Photo Surface Processor PL21-200" manufactured by Sen Lights Corporation). Regarding the boron nitride particles 1 after the heat treatment and ultraviolet irradiation, the polarity term of the surface energy was calculated in the same manner as in Example 1.

An epoxy resin composition was prepared by the same manner as described in Example 2, except that the boron nitride particles 1 and α-alumina particle after the heat treatment and ultraviolet irradiation were used. By using the prepared epoxy resin composition, a B-stage sheet and an epoxy resin cured product were produced in the same manner as in Example 1. Then, in the same manner as in Example 1, the length (cycle length) of one period of the periodic structure, the thermal conductivity, the dielectric breakdown electric field, the presence or absence of the domain, the presence or absence of the smectic structure, the ratio of the smectic domain to the entire resin matrix, and the handling properties of the sheet were confirmed.

Example 6

An epoxy resin composition was prepared by the same manner as described in Example 1, except that a liquid crystalline epoxy monomer (1-(3-methyl-4-oxiranyl-methoxyphenyl)-4-(oxiranylmethoxyphenyl)-1-cyclo-hexane) (hereinafter also referred to as "resin 2"), which is different from Formula (I), was used, instead of resin 1. By using the prepared epoxy resin composition, a B-stage sheet and an epoxy resin cured product were produced in the same manner as in Example 1. Then, in the same manner as in Example 1, the length (cycle length) of one period of the periodic structure, the thermal conductivity, the dielectric breakdown electric field, the presence or absence of the domain, the presence or absence of the smectic structure, the ratio of the smectic domain to the entire resin matrix, and the handling properties of the sheet were confirmed.

Example 7

An epoxy resin composition was prepared by the same manner as described in Example 1, except that resin 3 was used instead of resin 1, in which resin 3 is mixture of resin 1 and a non-liquid crystalline epoxy monomer (product name: "YL6121H" manufactured by Mitsubishi Chemical Corporation) at mole ratio (resin 1: YL6121H) of 8:2. By using the prepared epoxy resin composition, a B-stage sheet and an epoxy resin cured product were produced in the same manner as in Example 1. Then, in the same manner as in Example 1, the thermal conductivity, the dielectric breakdown electric field, the presence or absence of the domain, the presence or absence of the smectic structure, and the handling properties of the sheet were confirmed.

Comparative Example 1

An epoxy resin composition was prepared by the same manner as described in Example 1, except that a non-liquid crystalline epoxy monomer (product name: "jER828" manufactured by Mitsubishi Chemical Corporation) (hereinafter also referred to as "resin 4"), was used, instead of resin 1. By using the prepared epoxy resin composition, a B-stage sheet and an epoxy resin cured product were produced in the same manner as in Example 1. Then, in the same manner as in Example 1, the length (cycle length) of one period of the periodic structure, the thermal conductivity, the dielectric breakdown electric field, the presence or absence of the domain, the presence or absence of the smectic structure, the ratio of the smectic domain to the entire resin matrix, and the handling properties of the sheet were confirmed.

Comparative Example 2

An epoxy resin composition was prepared by the same manner as described in Example 2, except that resin 4 was used instead of resin 1. By using the prepared epoxy resin composition, a B-stage sheet and an epoxy resin cured product were produced in the same manner as in Example 1. Then, in the same manner as in Example 1, the thermal conductivity, the dielectric breakdown electric field, the presence or absence of the domain, the presence or absence of the smectic structure, and the handling properties of the sheet were confirmed.

Comparative Example 3

An epoxy resin composition was prepared by the same manner as described in Example 3, except that resin 4 was used instead of resin 1. By using the prepared epoxy resin composition, a B-stage sheet and an epoxy resin cured product were produced in the same manner as in Example 1. Then, in the same manner as in Example 1, the thermal conductivity, the dielectric breakdown electric field, the presence or absence of the domain, the presence or absence of the smectic structure, and the handling properties of the sheet were confirmed.

Comparative Example 4

An epoxy resin composition was prepared by the same manner as described in Example 4, except that resin 4 was used instead of resin 1. By using the prepared epoxy resin composition, a B-stage sheet and an epoxy resin cured product were produced in the same manner as in Example 1. Then, in the same manner as in Example 1, the thermal conductivity, the dielectric breakdown electric field, the presence or absence of the domain, the presence or absence of the smectic structure, and the handling properties of the sheet were confirmed.

Comparative Example 5

An epoxy resin composition was prepared by the same manner as described in Example 5, except that resin 4 was used instead of resin 1. By using the prepared epoxy resin composition, a B-stage sheet and an epoxy resin cured product were produced in the same manner as in Example 1. Then, in the same manner as in Example 1, the thermal conductivity, the dielectric breakdown electric field, the presence or absence of the domain, the presence or absence of the smectic structure, and the handling properties of the sheet were confirmed.

Comparative Example 6

An epoxy resin composition was prepared by the same manner as described in Example 1, except that a non-liquid crystalline epoxy monomer (product name: "YL6121H" manufactured by Mitsubishi Chemical Corporation) (hereinafter also referred to as "resin 5") was used instead of resin 1. By using the prepared epoxy resin composition, a B-stage sheet and an epoxy resin cured product were produced in the same manner as in Example 1. Then, in the same manner as in Example 1, the thermal conductivity, the dielectric breakdown electric field, the presence or absence of the domain, the presence or absence of the smectic structure, and the handling properties of the sheet were confirmed.

Comparative Example 7

With respect to hexagonal boron nitride particles of spherical aggregated particles (an aspect ratio: 1.5, volume average particle diameter: 40 µm, manufactured by MIZUSHIMA FERROALLOY CO., LTD, product name: "HP-40") (hereinafter also referred to as "boron nitride particle 2"), the polarity term of the surface energy were calculated in the same manner as in Example 1.

An epoxy resin composition was prepared by the same manner as described in Comparative Example 6, except that boron nitride particle 2 was used instead of boron nitride particle 1. By using the prepared epoxy resin composition, a B-stage sheet and an epoxy resin cured product were produced in the same manner as in Example 1. Then, in the same manner as in Example 1, the thermal conductivity, the dielectric breakdown electric field, the presence or absence of the domain, the presence or absence of the smectic structure, and the handling properties of the sheet were confirmed.

Comparative Example 8

An epoxy resin composition was prepared by the same manner as described in Example 1, except that boron nitride particle 2 was used instead of boron nitride particle 1. By using the prepared epoxy resin composition, a B-stage sheet and an epoxy resin cured product were produced in the same manner as in Example 1. Then, in the same manner as in Example 1, the thermal conductivity, the dielectric breakdown electric field, the presence or absence of the domain, the presence or absence of the smectic structure, and the handling properties of the sheet were confirmed.

With respect to epoxy resin compositions of Examples 1 to 7 and Comparative Examples 1 to 8, components, condition of oxidation treatment of boron nitride particles or α-alumina particles and polarity term of the surface energy of boron nitride particle were shown in Table 1. In Table 1, "–" in the term of boron nitride particles or α-alumina particles represents "not mixed" thereof "–" in the term of condition of oxidation treatment represents "do not treated".

With respect to semi-cured and cured epoxy resin compositions of Examples 1 to 7 and Comparative Examples 1 to 8, evaluated results were shown in Table 2. In Comparative Examples 1 to 7, there were no domain in the resin matrix, therefore, cycle length and the ratio of the smectic domain were not measured.

particles 1 having an aspect ratio of 2.7. This is considered to be because the regularity of the periodic structure was enhanced by the boron nitride particles 1 having an aspect ratio of 2.7.

TABLE 1

|  | Content of Boron nitride particle 1 (% by mass) | Content of Boron nitride particle 2 (% by mass) | Content of α-alumina particle (% by mass) | With or Without oxidation treatment of particle | Temperature of thermal treatment (° C.) | Time of thermal treatment (min) | Average UV irradiation intensity (mW/cm$^2$) | Polarity term of surface energy of boron nitride particles (mN/m) | UV irradiation time (min) | Epoxy monomer | Curing agent |
|---|---|---|---|---|---|---|---|---|---|---|---|
| Example 1 | 60 | — | — | without | — | — | — | 0.1 | — | Resin 1 | Phenol curing agent |
| Example 2 | 60 | — | 10 | without | — | — | — | 0.1 | — | | |
| Example 3 | 60 | — | — | with | 250 | 10 | — | 1.2 | — | | |
| Example 4 | 60 | — | — | with | — | — | 7 | 30 | 30 | | |
| Example 5 | 60 | — | 10 | with | 150 | 10 | 7 | 33 | 30 | | |
| Example 6 | 60 | — | — | without | — | — | — | 0.1 | — | Resin 2 | |
| Example 7 | 60 | — | — | without | — | — | — | 0.1 | — | Resin3 | |
| Comparative Example 1 | 60 | — | — | without | — | — | — | 0.1 | — | Resin 4 | |
| Comparative Example 2 | 60 | — | 10 | without | — | — | — | 0.1 | — | | |
| Comparative Example 3 | 60 | — | — | with | 250 | 10 | — | 1.2 | — | | |
| Comparative Example 4 | 60 | — | — | with | — | — | 7 | 30 | 30 | | |
| Comparative Example 5 | 60 | — | 10 | with | 150 | 10 | 7 | 33 | 30 | | |
| Comparative Example 6 | 60 | — | — | without | — | — | — | 0.1 | — | Resin 5 | |
| Comparative Example 7 | — | 60 | — | without | — | — | — | 0.1 | — | | |
| Comparative Example 8 | — | 60 | — | without | — | — | — | 0.1 | — | Resin 1 | |

TABLE 2

|  | Presence or Absence of domain | Presence or Absence of smectic structure | Cycle length (nm) semi-cured | Cycle length (nm) cured | Ratio of domain (vol %) | Thermal conductivity (W/(m · K)) | Dielectric breakdown electric field (kV/mm) | Handling properties of sheet |
|---|---|---|---|---|---|---|---|---|
| Example 1 | Presence | Presence | 2.5 | 2.5 | >95 | 6.1 | 29 | B |
| Example 2 | Presence | Presence | 2.5 | 2.5 | >95 | 6.5 | 30 | B |
| Example 3 | Presence | Presence | 2.5 | 2.5 | >95 | 6.3 | 29 | A |
| Example 4 | Presence | Presence | 2.5 | 2.5 | >95 | 6.4 | 29 | A |
| Example 5 | Presence | Presence | 2.5 | 2.5 | >95 | 6.8 | 29 | A |
| Example 6 | Presence | Presence | 2.5 | 2.5 | >95 | 6.1 | 30 | B |
| Example 7 | Presence | Presence | 2.5 | 2.5 | >95 | 6.0 | 29 | B |
| Comparative Example 1 | Absence | Absence | — | — | — | 2.5 | 29 | B |
| Comparative Example 2 | Absence | Absence | — | — | — | 2.7 | 29 | B |
| Comparative Example 3 | Absence | Absence | — | — | — | 2.7 | 29 | A |
| Comparative Example 4 | Absence | Absence | — | — | — | 2.7 | 29 | A |
| Comparative Example 5 | Absence | Absence | — | — | — | 2.8 | 29 | A |
| Comparative Example 6 | Absence | Absence | — | — | — | 2.9 | 29 | B |
| Comparative Example 7 | Absence | Absence | — | — | — | 4.4 | 22 | B |
| Comparative Example 8 | Presence | Presence | 2.5 | 2.5 | >95 | 6.8 | 22 | B |

As listed in Table 2, in Comparative Example 7 having no smectic domain, the thermal conductivity was lower than that of Comparative Example 8 having a smectic domain. In Comparative Examples 1 to 6 using the boron nitride particles 1 having an aspect ratio of 2.7, the thermal conductivity was lower than that of Comparative Example 7 using boron nitride particles 2 having an aspect ratio of 1.5.

On the other hand, in Examples 1 to 7 having a smectic domain, the thermal conductivity was as high as that of Comparative Example 8, while using the boron nitride Examples 1 to 7 using boron nitride particles 1 having an aspect ratio of 2.7 had higher dielectric breakdown electric field and excellent dielectric strength than Comparative Example 7 and Comparative Example 8 using boron nitride particles 2 having an aspect ratio of 1.5.

The entire contents of the disclosures by Japanese Patent Application No. 2015-104427 filed on May 22, 2015 are incorporated herein by reference.

All the literature, patent application, and technical standards cited herein are also herein incorporated to the same extent as provided for specifically and severally with respect to an individual literature, patent application, and technical standard to the effect that the same should be so incorporated by reference.

The invention claimed is:

1. An epoxy resin composition comprising:
hexagonal boron nitride particles having an aspect ratio of 2 or more;
a liquid crystalline epoxy monomer; and
a curing agent,
the epoxy resin composition forming a resin matrix having a smectic domain by reacting the liquid crystalline epoxy monomer with the curing agent, wherein, in the smectic domain, a periodic structure is formed in a direction intersecting with a (100) crystal face of a hexagonal boron nitride particle, and a periodic structure is formed in a direction along a (001) crystal face of the hexagonal boron nitride particle.

2. The epoxy resin composition according to claim 1, wherein the liquid crystalline epoxy monomer comprises a monomer represented by the following Formula (I):

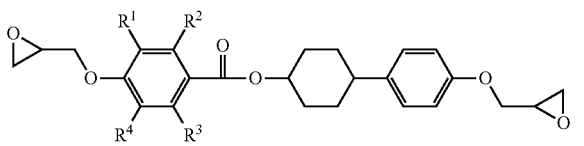

wherein, in Formula (I), each of $R^1$ to $R^4$ independently represents a hydrogen atom or an alkyl group having from 1 to 3 carbon atoms.

3. The epoxy resin composition according to claim 1, wherein the curing agent comprises a phenol novolak resin.

4. A thermally-conductive material precursor, comprising a semi-cured product of the epoxy resin composition according to claim 1.

5. The thermally-conductive material precursor according to claim 4, wherein the semi-cured product comprises a resin matrix having a smectic domain.

6. The thermally conductive material precursor according to claim 5, wherein, in the smectic domain, a periodic structure is formed in a direction intersecting with a (100) crystal face of a hexagonal boron nitride particle, and a periodic structure is formed in a direction along a (001) crystal face of the hexagonal boron nitride particle.

7. The thermally-conductive material precursor according to claim 5, wherein the smectic domain has a periodic structure having one cycle length of from 2 nm to 4 nm.

8. The epoxy resin composition according to claim 1, wherein the hexagonal boron nitride particles have an aspect ratio of 2 to 7.

9. The epoxy resin composition according to claim 1, wherein the smectic domain has a periodic structure having one cycle length of from 2 nm to 4 nm.

10. An epoxy resin composition comprising:
hexagonal boron nitride particles having an aspect ratio of 2 or more;
a liquid crystalline epoxy monomer; and
a curing agent,
the epoxy resin composition forming a resin matrix having a smectic domain by reacting the liquid crystalline epoxy monomer with the curing agent, wherein a content of the hexagonal boron nitride particles is 50% by mass or more with respect to a total solid content.

11. A B-stage sheet, comprising a sheet-shaped semi-cured product of the epoxy resin composition according to claim 10.

12. The B-stage sheet according to claim 11, wherein the semi-cured product comprises a resin matrix having a smectic domain.

13. The B-stage sheet according to claim 12, wherein, in the smectic domain, a periodic structure is formed in a direction intersecting with a (100) crystal face of a hexagonal boron nitride particle, and a periodic structure is formed in a direction along a (001) crystal face of the hexagonal boron nitride particle.

14. The B-stage sheet according to claim 12, wherein the smectic domain has a periodic structure having one cycle length of from 2 nm to 4 nm.

15. A heat dissipation material, comprising a cured product of the epoxy resin composition according to claim 10.

16. A laminate comprising:
an adherend; and
a cured layer of at least one resin-containing layer selected from the group consisting of a resin layer formed from the epoxy resin composition according to claim 10 disposed on the adherend.

17. A printed circuit board comprising:
a wiring layer;
a metal plate; and
a cured layer disposed between the wiring layer and the metal plate, wherein the cured layer comprises a cured layer of at least one resin-containing layer formed from the epoxy resin composition according to claim 10.

18. The epoxy resin composition according to claim 10, wherein the liquid crystalline epoxy monomer comprises a monomer represented by the following Formula (I):

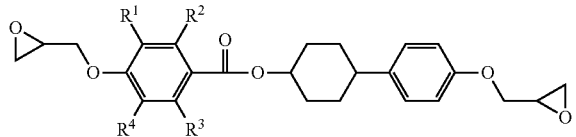

wherein, in Formula (I), each of $R^1$ to $R^4$ independently represents a hydrogen atom or an alkyl group having from 1 to 3 carbon atoms.

19. The epoxy resin composition according to claim 10, wherein the curing agent comprises a phenol novolak resin.

20. A prepreg comprising:
a fiber substrate; and
a semi-cured product of an epoxy resin composition impregnated in the fiber substrate, the epoxy resin composition comprising:
hexagonal boron nitride particles having an aspect ratio of 2 or more;
a liquid crystalline epoxy monomer; and
a curing agent,
the epoxy resin composition forming a resin matrix having a smectic domain by reacting the liquid crystalline epoxy monomer with the curing agent.

21. A metal substrate comprising:
a metal foil;
a metal plate; and a cured layer of at least one resin-containing layer formed from an epoxy resin composition claim 1 disposed between the metal foil and the metal plate, the epoxy resin composition comprising:

hexagonal boron nitride particles having an aspect ratio of 2 or more;

a liquid crystalline epoxy monomer; and a curing agent, the epoxy resin composition forming a resin matrix having a smectic domain by reacting the liquid crystalline epoxy monomer with the curing agent.

* * * * *